United States Patent
Mori et al.

(10) Patent No.: US 6,790,540 B2
(45) Date of Patent: Sep. 14, 2004

(54) ORGANIC ELECTROLUMINESCENT ELEMENT MATERIAL AND ORGANIC ELECTROLUMINESCENT ELEMENT

(75) Inventors: Tatsuo Mori, 5-6, Nishihioki 1-chome, Nakagawa-ku, Nagoya-shi, Aichi 454-0004 (JP); Teruyoshi Mizutani, 42-5, Okaue-cho 2-chome, Chikusa-ku, Nagoya-shi, Aichi 464-0837 (JP); Toru Takeda, Fukuoka (JP); Hiroshi Miyazaki, Fukuoka (JP); Koichi Yamashita, Fukuoka (JP)

(73) Assignees: Nippon Steel Chemical Co., Ltd., Tokyo (JP); Tatsuo Mori, Aichi (JP); Teruyoshi Mizutani, Aichi (JP)

( * ) Notice: Subject to any disclaimer, the term of this patent is extended or adjusted under 35 U.S.C. 154(b) by 0 days.

(21) Appl. No.: 10/258,533

(22) PCT Filed: May 31, 2001

(86) PCT No.: PCT/JP01/04607

§ 371 (c)(1),
(2), (4) Date: Oct. 25, 2002

(87) PCT Pub. No.: WO01/92437

PCT Pub. Date: Dec. 6, 2001

(65) Prior Publication Data

US 2003/0138663 A1 Jul. 24, 2003

(30) Foreign Application Priority Data

Jun. 1, 2000 (JP) .................................. 2000-164375
Jun. 1, 2000 (JP) .................................. 2000-164376

(51) Int. Cl.[7] .................. H05B 33/14; C09K 11/06; C07D 213/02; C07D 263/52; C07D 277/60
(52) U.S. Cl. ................. 428/690; 428/917; 313/504; 313/506; 252/301.16
(58) Field of Search ............................... 428/690, 917; 252/301.16; 313/504, 506; 546/4; 548/108, 156, 235

(56) References Cited

FOREIGN PATENT DOCUMENTS

| JP | 02-255790 | 10/1990 |
|---|---|---|
| JP | 2000-144125 | 5/2000 |
| JP | 2000-355687 | 12/2000 |

OTHER PUBLICATIONS

Inorganica Chimica Acta, vol. 278, (1998), pp. 178–184.*
Russian Journal of General Chemistry, vol. 68, No 3, (1998), pp. 463–468.*
Japanese Patent Office (JPO) machine translation of JP 200-144125 (publication date May 26, 2000).*
American Chemistry Society four page summary of Russian Journal of General Chemistry, vol. 68, No. 3, (1998), pp. 463–468.*
International Search Report for PCT/JP01/04607 mailed on Jul. 31, 2001.
International Preliminary Examination Report for PCT/JP01/04607 mailed on Jul. 14, 2003.

* cited by examiner

Primary Examiner—Dawn Garrett
(74) Attorney, Agent, or Firm—Rader, Fishman & Grauer PLLC

(57) ABSTRACT

This invention relates to a low-molecular-weight compound which is soluble in solvents and useful for a luminescent material and to an organic electroluminescent element (EL element) which comprises said luminescent material in its electroluminescent layer. The EL element comprises an EL material represented by the following formula (1) between electrodes at least one of which is transparent

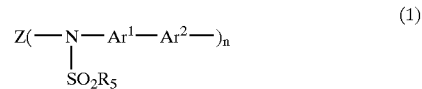
(1)

In formula (1), $Ar^1$ is a group represented by the following formula (2), $Ar^2$ is a group represented by the following formula (3) or (4) and $Ar^1$ and $Ar^2$ may condense to form a 10-membered ring in case $Ar^2$ is represented by the following formula (3);

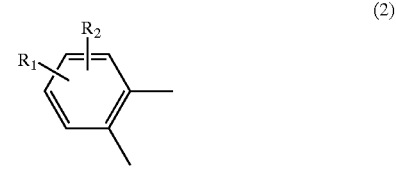

(2)

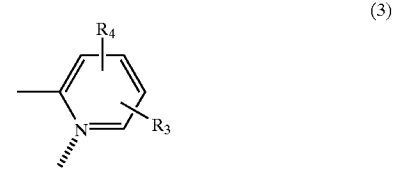

(3)

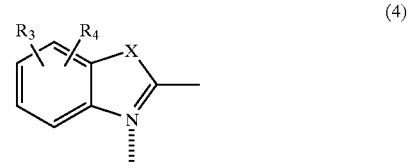

(4)

wherein $R_1$–$R_4$ and $R_5$ are hydrogen, alkyl, aryl and the like, Z is a divalent or trivalent metal such as zinc, aluminum, copper, beryllium, ruthenium, cobalt, rhodium, iridium and platinum and n is 2 or 3.

5 Claims, 1 Drawing Sheet

ORGANIC ELECTROLUMINESCENT ELEMENT MATERIAL AND ORGANIC ELECTROLUMINESCENT ELEMENT

FIELD OF TECHNOLOGY

This invention relates to a luminescent material and an organic electroluminescent element and, more particularly, to an organic electroluminescent element material (EL material) which is used as a luminescent body in a variety of displays and to an organic electroluminescent element (EL element) prepared from said EL material.

BACKGROUND TECHNOLOGY

An EL element utilizing electroluminescence is characterized by its high visibility because of self-luminescence and by its high impact resistance because of its being a completely solid element and is used in a thin display element, back light of a liquid crystal display and planar light source.

Some of known EL elements use a diamine derivative in the hole transporting layer and a complex of aluminum and 8-hydroxyquinoline (hereinafter referred to as Alq3) in the luminescent layer and emit green light at low direct-current voltage [Appl. Phys. Lett., 51, 913 (1987)]. Moreover, it is disclosed that the color of electroluminescence can be changed from green to yellow or red by the use of Alq3 alone [J. Appl. Phys. 65 (9), May (1989)].

The luminescent layer of EL elements which are currently in practical use is prepared as film from materials of low molecular weight by the technique of vacuum deposition while using Alq3 and the like as a luminescent material. In 1990, Burroughes et al. at the Cambridge University succeeded in observing an occurrence of electroluminescence from poly(p-phenylvinylene); induced with this success, the subject of high-molecular-weight EL materials is now receiving vigorous investigation. It is the film-making technique that will gain the greatest advantage from replacement of a low-molecular-weight material in the organic layer with a high-molecular-weight material: that is, a high-molecular-weight material in solution can be made into film by such coating technique as spin coating, dip coating and ink jet printing. Advantages of coating over vacuum deposition are, for example, ease of film making over a large-area substrate, low cost of a film-making apparatus and a short film-making time. However, high-molecular-weight materials generally have difficult problems in control of molecular weight and in purification. Metal complexes containing a ligand of an 8-aminoquinoline skeleton (JP2-255790 A) and compounds containing a ligand of oxazole ring or phenylpyridine ring (Toyota Central R & D Labs, Inc., R & D Review, Vol. 33, No. 2, pp. 3–21, June, 1998) have been reported, but they have not yielded high-performance elements emitting blue light.

DISCLOSURE OF THE INVENTION

Accordingly, an object of this invention is to provide a low-molecular-weight EL material which shows fluorescent quality comparable to that of the aforementioned Alq3 in the solid state and is soluble in an organic solvent such as chloroform and toluene. Another object of this invention is to provide an EL element prepared from the aforementioned EL material. A further object of this invention is to provide an EL material which emits blue fluorescent light with its principal wavelength located in the vicinity of 450 nm.

This invention relates to an organic electroluminescent element material represented by general formula (1).

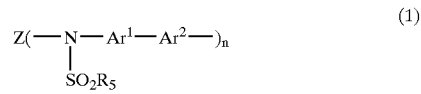

(1)

wherein $Ar^1$ is a group represented by the following formula (2) and $Ar^2$ is a group represented by the following formula (3) or (4) and, in case $Ar^2$ is represented by formula (3), $Ar^1$ and $Ar^2$ may condense to form a 10-membered ring.

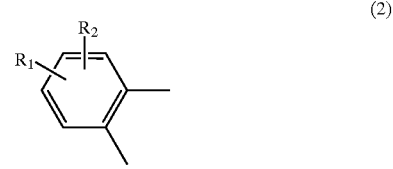

(2)

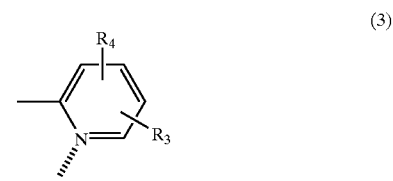

(3)

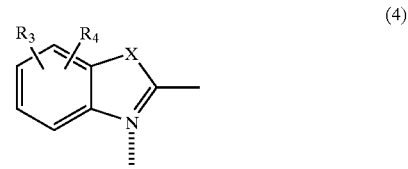

(4)

In formulas (2), (3) and (4), $R_1$–$R_4$ are independently hydrogen, halogen, an alkyl group with 1–6 carbon atoms, an alkoxy group with 1–6 carbon atoms, an aryloxy group with 6–18 carbon atoms, phenyl group, a substituted phenyl group with up to 18 carbon atoms, amino group, a substituted amino group or hydroxyl group and $R_1$ and $R_2$ or $R_3$ and $R_4$ in adjacent position may link together to form a saturated or unsaturated 5- or 6-membered ring. The group $R_5$ is hydrogen, an alkyl group with 1–16 carbon atoms, an alkoxy group with 1–6 carbon atoms, an aryloxy group with 6–18 carbon atoms, an alkyl group with 1–16 carbon atoms optionally containing a substituent selected from phenyl, amino, cyano, nitro, hydroxyl and halogen, an aryl group with 6–20 carbon atoms or an aralkyl group with 7–20 carbon atoms; in case $Ar^1$ and $Ar^2$ condense to form a 10-membered ring, R5 is an alkyl group with 6–16 carbon atoms optionally containing 1 or more of the aforementioned substituents, an aryl group with 6–20 carbon atoms or an aralkyl group with 7–20 carbon atoms. The group X is O or S, Z is a metal linked to N in formula (1) and to N constituting the hetero ring of $Ar^2$ and is a divalent or trivalent metal selected from zinc, aluminum, copper, beryllium, ruthenium, cobalt, rhodium, iridium and platinum and n is 2 or 3.

El materials represented by the aforementioned formula (1) include compounds represented by the following general formulas (5), (6) and (7).

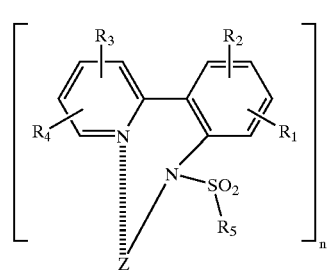

(5)

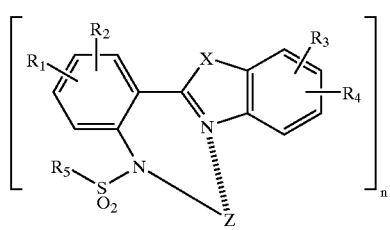

(6)

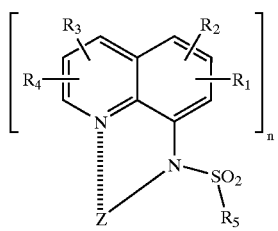

(7)

Moreover, this invention relates to an EL element which contains the aforementioned EL material between two electrodes at least one of which is transparent. Still more, this invention relates to an EL element which contains at least one kind of the aforementioned EL material in its luminescent or electron transporting layer.

The EL materials of this invention are represented by the aforementioned general formula (1) and comprise the compounds represented by the aforementioned general formulas (5), (6) and (7).

The symbols in the aforementioned general formulas (5), (6) and (7) are the same as those in the aforementioned general formulas (1) to (4). However, $R_5$ is preferably a group with 6 or more carbon atoms from the viewpoint of solvent solubility; for example, an alkyl group with 6–16 carbon atoms optionally containing one or more of the aforementioned substituents, an aryl group with 6–20 carbon atoms and an aryl group with 7–20 carbon atoms. In particular, $R_5$ is preferably an alkyl group with 6–16 carbon atoms in a compound represented by formula (7).

The compounds represented by the aforementioned general formula (1) can be prepared by a variety of known methods; the following method is cited as an example.

An amine is treated with a sulfonyl chloride in pyridine and the reaction product is treated with a metal sulfate in alcohol.

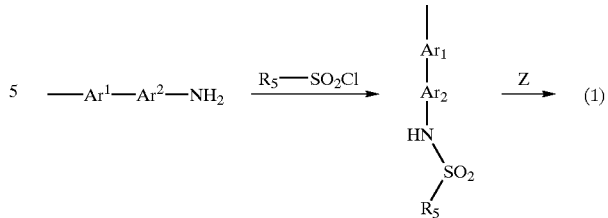

(1)

The compounds represented by the aforementioned general formula (5) can also be prepared by a variety of known methods. 2-Tributylstannylpyridine or its derivative is coupled with 2-iodonitrobenzene or its derivative and the nitro group is reduced to amino group. Thereafter, the resulting amine is treated with a variety of sulfonyl chlorides in pyridine and the reaction product is treated with a metal sulfate in alcohol. An example is shown below.

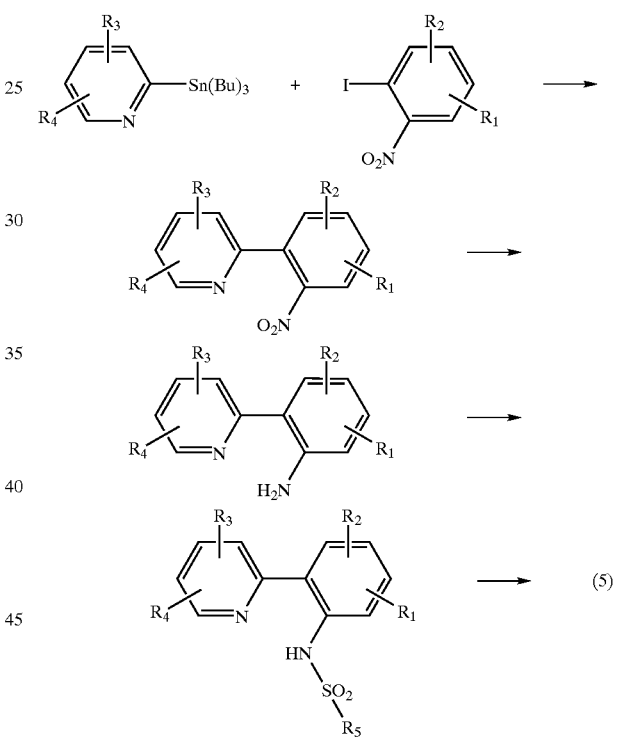

(5)

Likewise, the compounds represented by the aforementioned general formula (6) can be prepared by a variety of known methods. Anthranilic acid or its derivative is coupled with ortho-aminophenol or its derivative and the coupled product is treated with a variety of sulfonyl chlorides in pyridine and the reaction product is treated with a metal sulfate in alcohol to give a product represented by formula (6). An example is shown below.

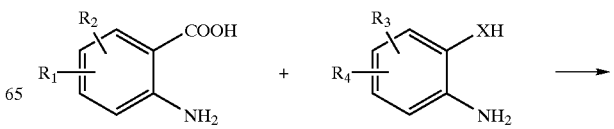

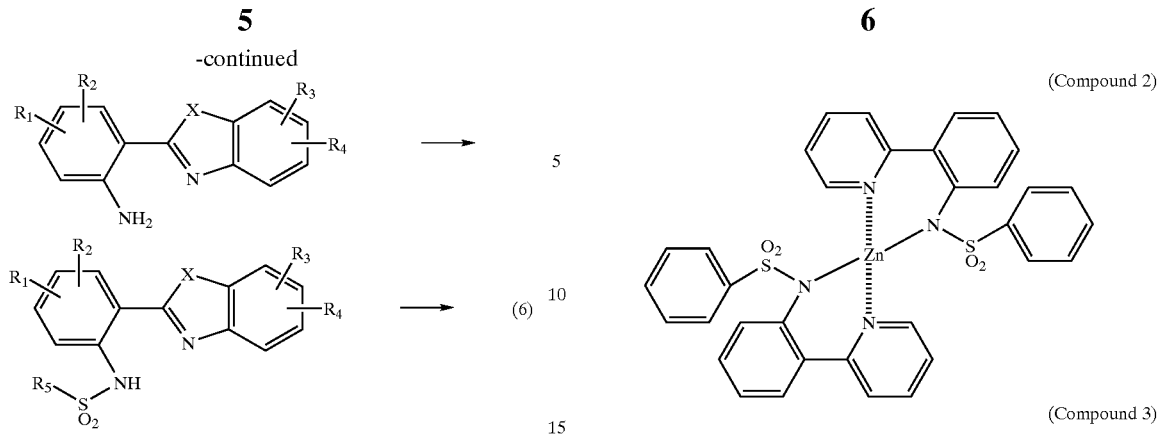

The compounds represented by the aforementioned general formula (7) can be prepared by a variety of known methods. 8-Aminoquinoline or its derivative is treated with a variety of sulfonyl chlorides in pyridine and the reaction product is treated with a metal sulfate in alcohol to give a product represented by general formula (7).

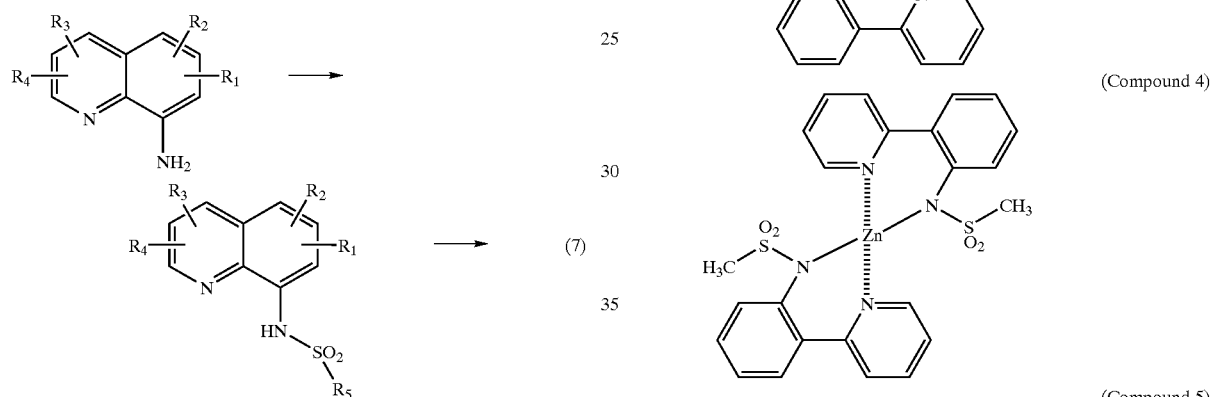

In the aforementioned general formulas (1) to (7), $R_1$–$R_4$, $R_5$, X, Z and n are as defined above. Preferable as $R_1$–$R_4$ are hydrogen, halogen or a lower alkyl group (with 5 or less carbon atoms). Moreover, two of $R_1$–$R_4$ are preferably hydrogen. In case at least two of $R_1$–$R_4$ in adjacent position link together to form a ring, preferably a benzene ring, the new benzene ring condenses with the existing benzene ring bearing the two in question to form a naphthalene ring. Suitable for R5 are hydrogen, an alkyl group with 1–16 carbon atoms, an aryl group with 6–20 carbon atoms such as phenyl group, a substituted phenyl group containing 1 or 2 alkyl groups, biphenylyl and naphthyl, an aralkyl group with 7–20 carbon atoms and the foregoing aryl, alkyl and aralkyl groups containing 1 or 2 substituents selected from alkyl groups with 1–16 carbon atoms, alkoxy groups with 1–6 carbon atoms, aryloxy groups with 6–18 carbon atoms, phenyl, amino, cyano, nitro, hydroxyl and halogen. Here, $R_5$ in the compounds represented by formula (7) contains 6 or more carbon atoms, and in case the substituent contains carbon, the number of carbon atoms of $R_5$ is calculated by adding the number of carbon atoms in the substituent. Preferably, $R_5$ is an aryl, alkyl or aralkyl group with 6–16 carbon atoms, X is O or S and Z is Zn or Al. The symbol n is 2 or 3 corresponding to the valence of Z.

Concrete examples of the compounds represented by the aforementioned general formula (1) are shown below, but this invention is not limited to them.

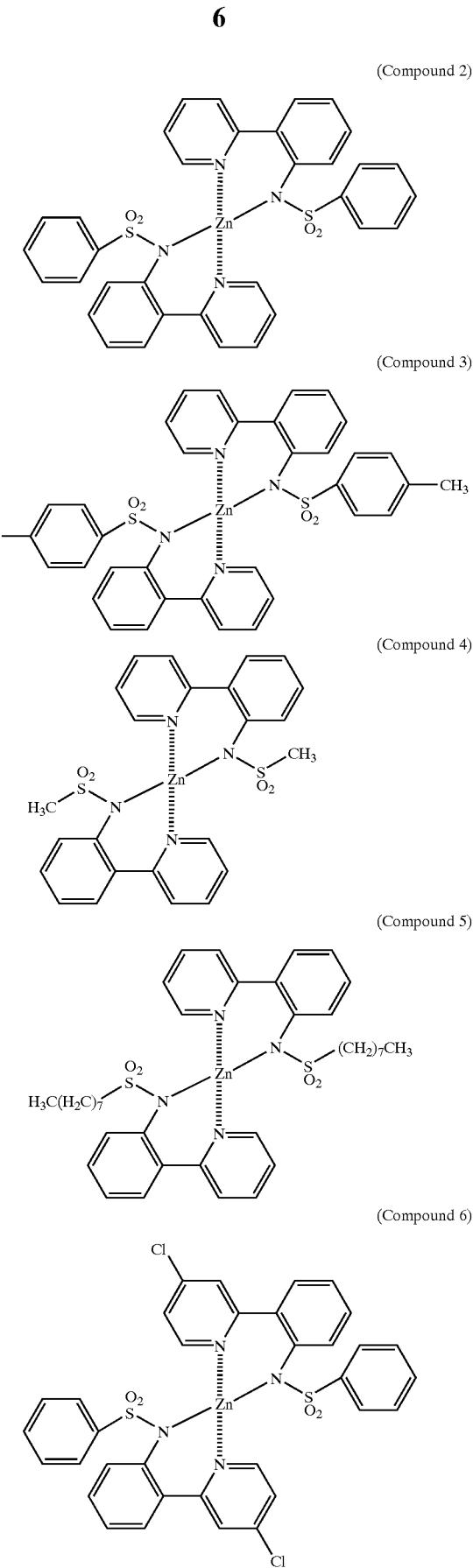

-continued
(Compound 7)
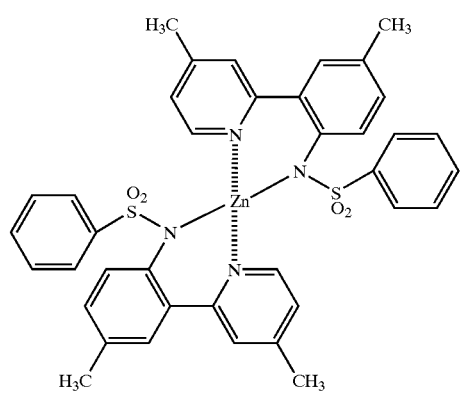
(Compound 8)
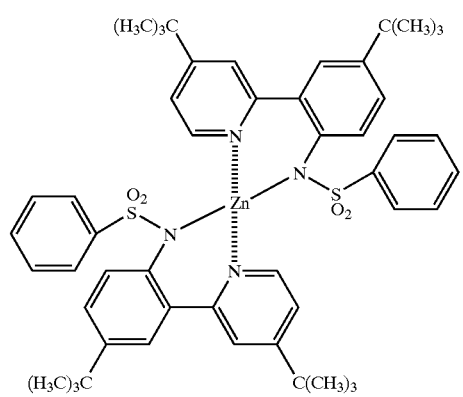
(Compound 9)
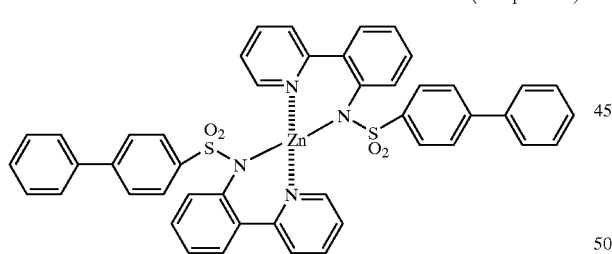
(Compound 10)
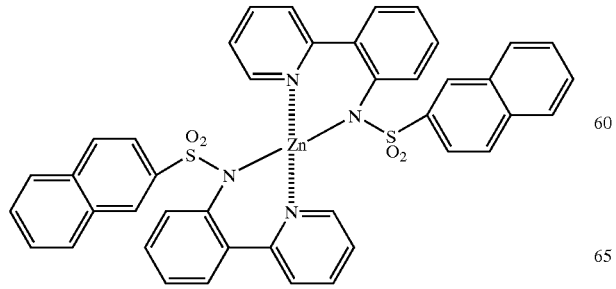
-continued
(Compound 11)
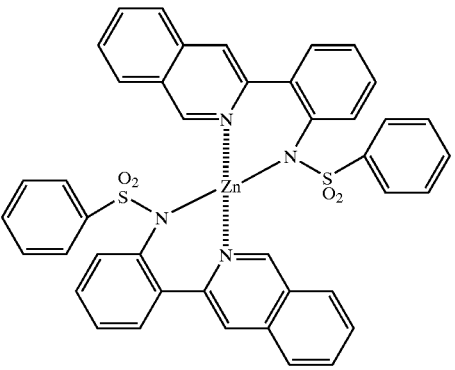
(Compound 12)
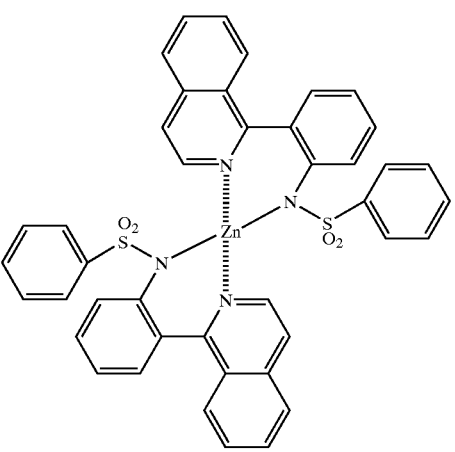
(Compound 13)
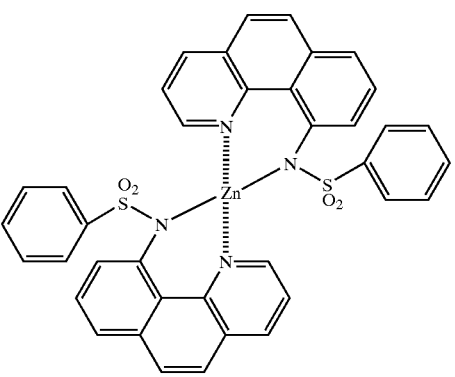
(Compound 14)
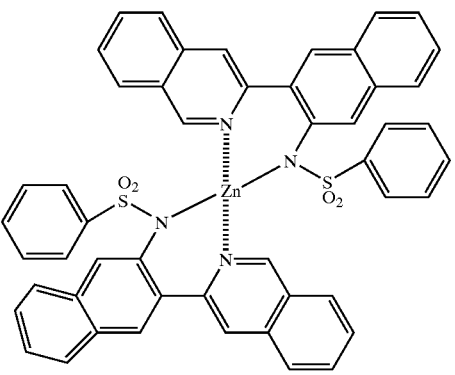

(Compound 15)
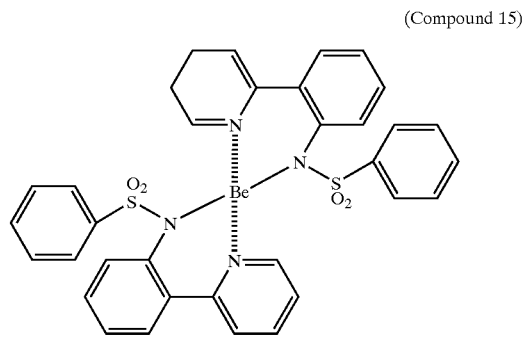
(Compound 19)
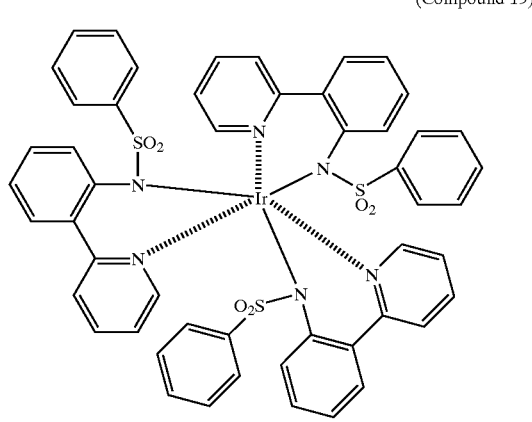
(Compound 16)
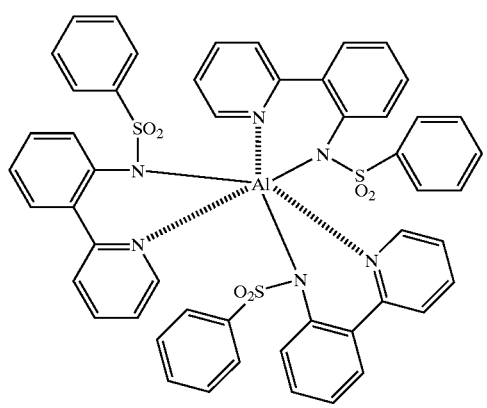
(Compound 2a)
(Compound 3a)
(Compound 17)
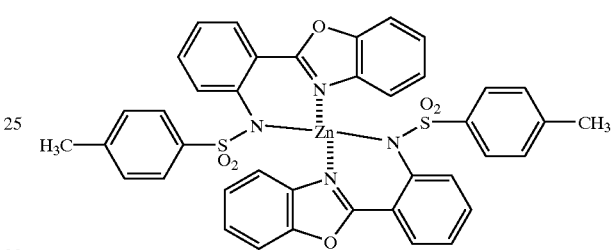
(Compound 4a)
(Compound 18)
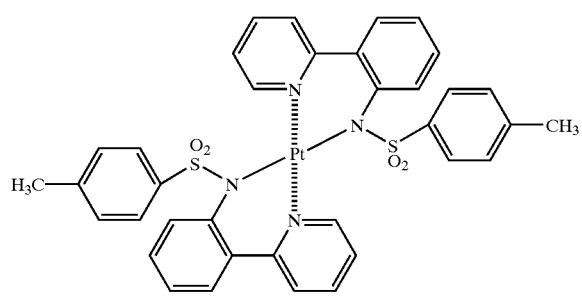
(Compound 5a)
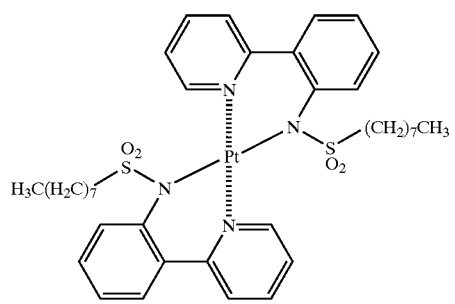

(Compound 6a)
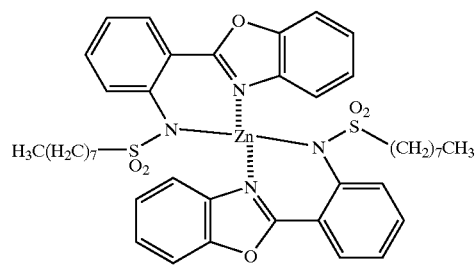
(Compound 7a)
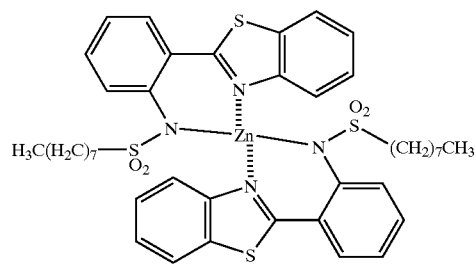
(Compound 8a)
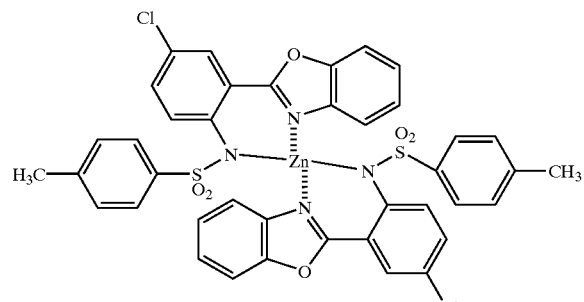
(Compound 9a)
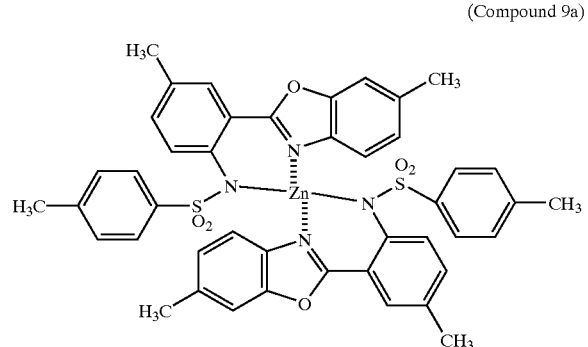
(Compound 10a)
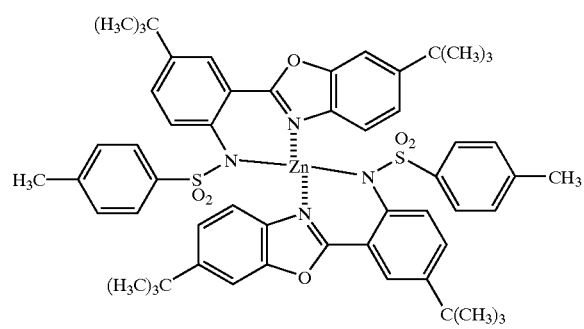
(Compound 11a)
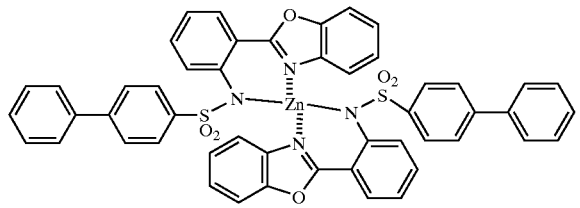
(Compound 12a)
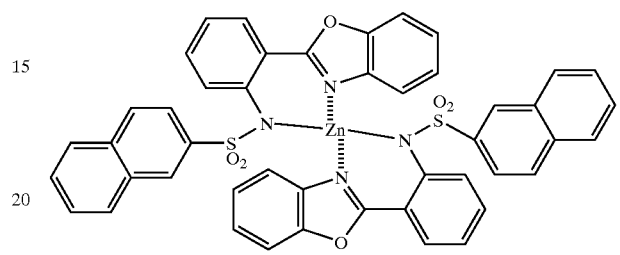
(Compound 13a)
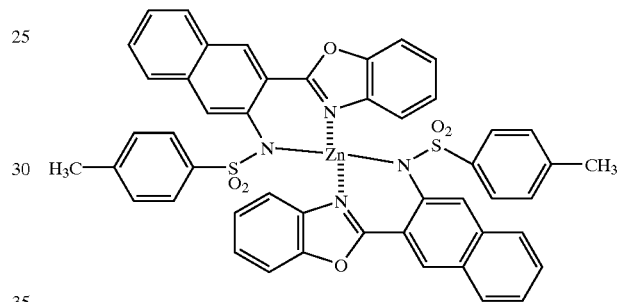
(Compound 14a)
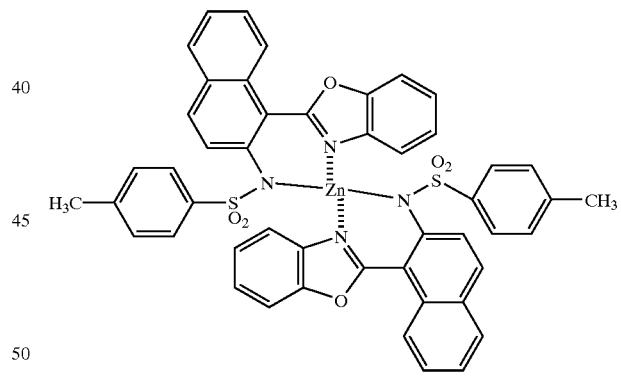
(Compound 15a)
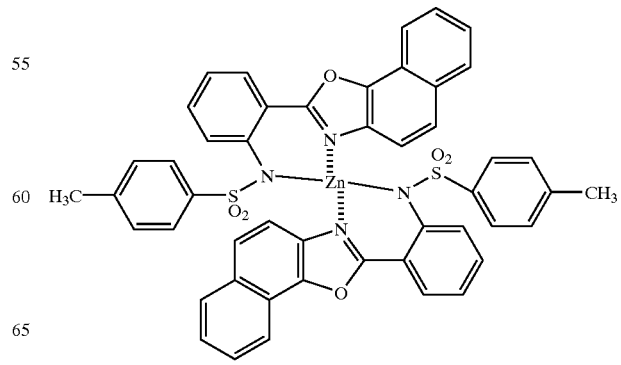

(Compound 16a)
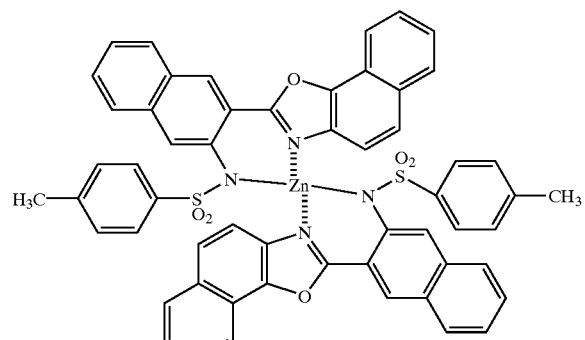
(Compound 17a)
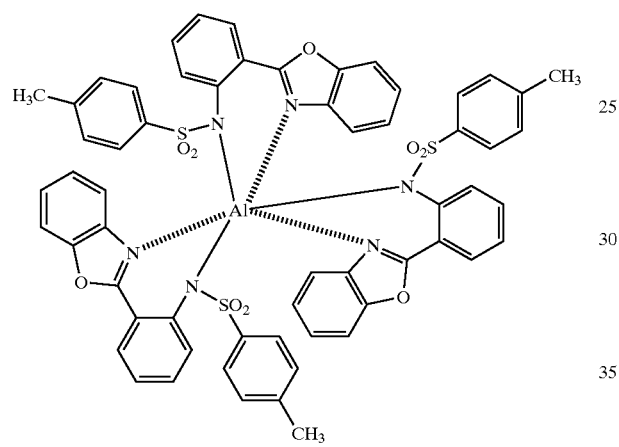
(Compound 18a)
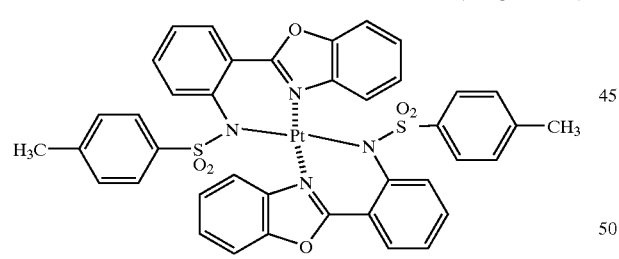
(Compound 19a)
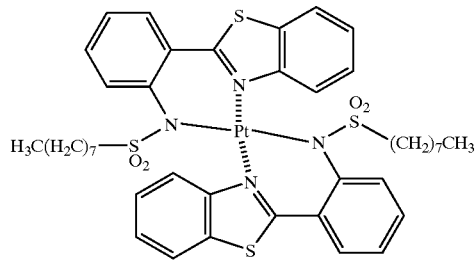
(Compound 20a)
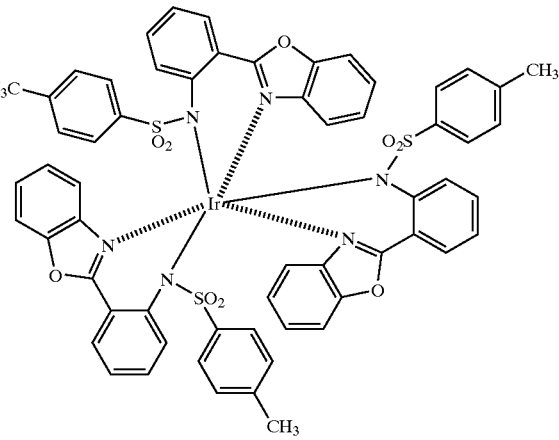
(Compound 21a)
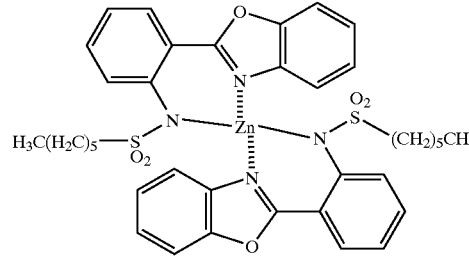
(Compound 22a)
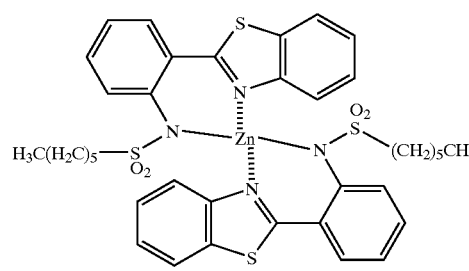
(Compound 23a)
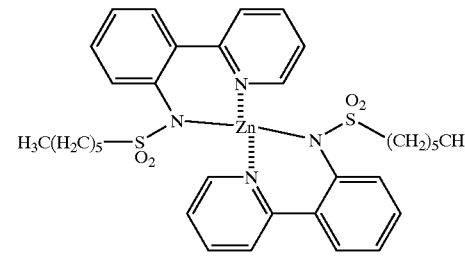
(Compound A)
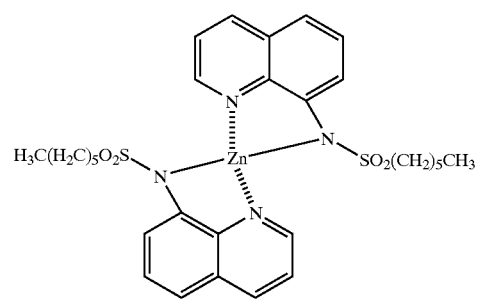

-continued (Compound B)

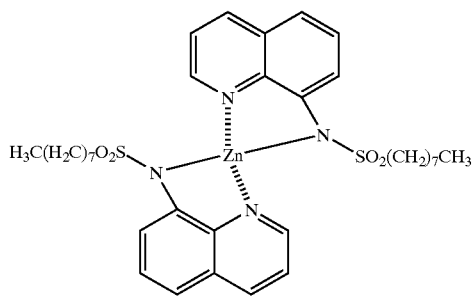

(Compound C)

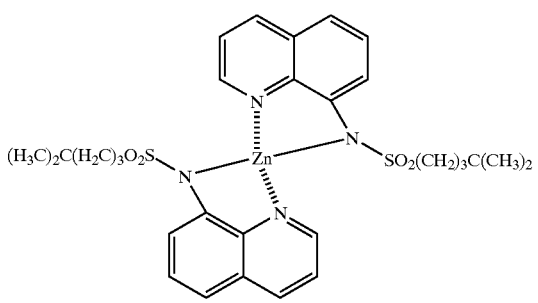

Of the compounds exemplified above, the following are preferable: zinc bis-2-(2-(p-toluenesulfonamido)phenyl) pyridinate, zinc bis-2-(2-(n-octylsulfonamido)phenyl) pyridinate, zinc bis-8-(n-octylsulfonamido)quinolinate, zinc bis-2-(2-(p-toluenesulfonamido)phenyl)benzoxazolate, zinc bis-2-(2-(p-toluenesulfonamido)phenyl)benzothiazolate, zinc bis-2-(2-(n-octylsulfonamido)phenyl)benzoxazolate and zinc bis-2-(2-(n-octylsulfonamido)phenyl) benzothiazolate.

The organic metal complexes represented by the aforementioned general formula (1) are effective as EL materials, particularly as luminescent materials or electron transporting materials in EL elements.

An EL element should have an organic luminescent layer as an essential constituent layer between a pair of electrodes at least one of which is transparent and is subject to no other restriction. For example, an arrangement of an organic luminescent layer, a hole injecting layer and an electron transporting layer interposed between a pair of electrodes is cited as a desirable structure.

Concrete examples of the structures of this kind include the following;
a) anode/organic luminescent layer/cathode
b) anode/hole transporting layer/organic luminescent layer/cathode
c) anode/hole injecting layer/hole transporting layer/organic luminescent layer/cathode
d) anode/organic luminescent layer/electron transporting layer/cathode
e) anode/organic luminescent layer/electron transporting layer/electron injecting layer/cathode
f) anode/hole transporting layer/organic luminescent layer/electron transporting layer/cathode
g) anode/hole injecting layer/hole transporting layer/organic luminescent layer/electron transporting layer/cathode
h) anode/hole injecting layer/hole transporting layer/organic luminescent layer/electron transporting layer/electron injecting layer/cathode.

A light-absorbing diffusion layer may be interposed if necessary. Because of their excellent electron transporting and light emitting performance, the aforementioned EL materials are advantageously used in the electron transporting layer or organic luminescent layer, particularly in the organic luminescent layer. Furthermore, EL materials of this invention can be used singly or as a mixture of two kinds or more.

In the preparation of a luminescent layer from an EL material or a metal complex of this invention, an EL material represented by general formula (1) is made into thin film by a known technique such as spin coating and casting and, besides, patterning by ink jet printing is expected to become feasible. The conventional technique of vapor deposition can naturally be used for making thin film. The film thickness is preferably 10–1,000 nm, more preferably 20–200 nm.

Likewise, in the preparation of an electron transporting layer, the compound in question is made into thin film by a known technique such as spin coating, casting, ink jet printing and vapor deposition. The film thickness is preferably 10–1,000 nm, more preferably 20–200 nm.

The substrate that supports the aforementioned structural elements should meet the requirements for mechanical and thermal strength and transparency, but no other, and examples include plates of glass such as soda glass, nonfluorescent glass, phosphate glass and silicate glass, quartz, plates or films of plastics such as acrylic resins, polyethylene, polyesters and silicones, plates and foils of metals such as alumina and other known materials.

Materials for the anode include metals, alloys and electrically conductive compounds, all of a high work function, and their mixtures. Concrete examples are gold, CuI, indium tin oxide (ITO), $SnO_2$, ZnO and other known materials.

Materials for the cathode include metals, alloys and electrically conductive compounds, all of a low work function, and their mixtures. Concrete examples are Na, Na—K alloy, Mg, Li, Mg—Al alloy, Al—$AlO_2$, In, rare earth metals and other known materials.

Since at least one of the aforementioned electrodes allows the emitted light to emerge, that electrode needs to be transparent or translucent and the transmission of the side from which light emerges is preferably made 10% or more.

Materials useful for the hole transporting layer include aromatic amine derivatives, porphyrin derivatives, phthalocyanine compounds, poly(vinylcarbazole) and other known compounds.

Materials useful for the hole injecting layer include triazole compounds, oxadiazole derivatives, imidazole derivatives, polyarylalkane derivatives, pyrazoline and pyrazolone derivatives, phenylenediamine derivatives, arylamine derivatives, oxazole derivatives, styrylanthracene derivatives, fluorene derivatives, hydrozone derivatives, stilbene derivatives, porphyrin derivatives, organic tertiary amine compounds, tetraphenylbenzidine derivatives and other known compounds. Particularly preferable are porphyrin compounds, tertiary amine compounds and styrylamine compounds.

Materials forming the electron injecting layer or the electron transporting layer or compounds exhibiting electron transporting capability and useful for the electron injecting material or the electron transporting material (may occasionally be present in the luminescent layer or elsewhere) include LiF, Alq3 and its derivatives, nitro-substituted fluorenone derivatives, thiopyran dioxide derivatives, diphenoquinone derivatives, perylene tetracarboxyl derivatives, anthraquinodimethan derivatives, fluorenylidenemethane derivatives, anthrone derivatives, oxadiazole derivatives, perinone derivatives, quinoline derivatives and other known compounds besides the EL materials of this invention.

In order to improve the heat resistance of the aforementioned layers of organic compounds such as the hole injecting layer, hole transporting layer and electron injecting layer, it is allowable to introduce polymerizable substituents to those organic compounds which constitute these layers and polymerize the substituted compounds before, during or after the formation of film.

PREFERRED EMBODIMENTS OF THE INVENTION

Figure 1:
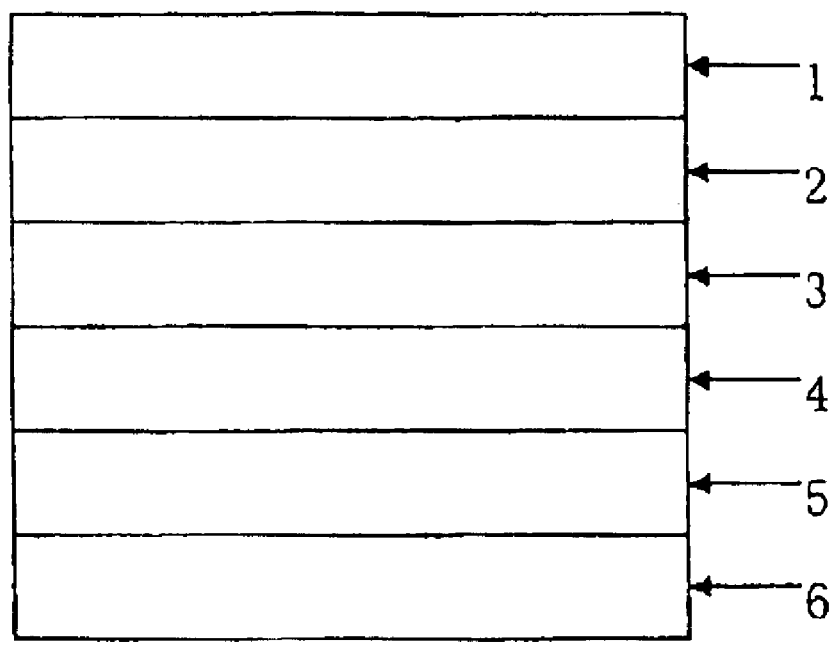
FIG. 1 shows the cross section of an EL element of this invention. The element has a layered structure comprising a glass substrate 1, an anode (ITO) 2, a hole transporting material 3, a luminescent and electron transporting material 4, an electron injecting layer (LiF) 5 and a cathode 6.

This invention will be described concretely below with reference to the examples.

EXAMPLE 1

Synthesis of zinc bis-8-(n-octylsulfonamido) quinolinate (Compound B)

The reaction of 5.0 g (0.0347 mole) of 8-aminoquinoline with 6.8 ml (0.0347 mole) of n-octanesulfonyl chloride was carried out in 10 ml of pyridine at room temperature. After 2 hours from the start of the reaction, the reaction mixture was washed with water, extracted with diethyl ether, purified by column chromatography and concentrated to give 10.23 g (0.032 mole, 92%) of 8-(n-octylsulfonamido)quinoline (Compound J).

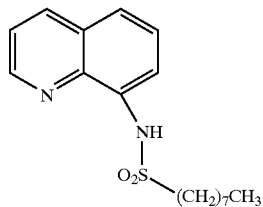

(Compound J)

Compound J was identified by a proton nuclear magnetic resonance measurement [$^1$H-NMR; solvent, CDCl$_3$].

Next, 5.0 g (0.016 mole) of Compound J, 2.12 g (0.016 mole) of zinc chloride and 4.74 g (0.047 mole) of triethylamine were suspended in 30 ml of ethanol and allowed to react at room temperature. After 3 hours, the separated yellow powder was filtered, washed with ethanol, and purified by column chromatography to give 10.14 g (90.0%) of Compound B as yellow crystals. The maximum PL wavelength of Compound B in chloroform was 509 nm (concentration, 0.1 mM; solvent, CHCl$_3$; excitation, 350 nm).

$^1$H-NMR. δ (DMSO-d6): 0.81 (t, J=6.8 Hz, 6H), 1.17–1.29 (br m, 20H), 1.68 (m, 2H), 7.57 (dd, J=1.2 Hz, 7.8 Hz, 2H), 7.65 (d, J=7.6 Hz, 2H), 7.69 (d, J=7.6 Hz, 2H), 7.76 (dd, J=4.8 Hz, 8.4 Hz, 2H), 8.71 (d, J=8.4 Hz, 2H), 8.80 (d, J=4.8 Hz, 2H).

EXAMPLE 2

Synthesis of zinc bis-2-(2-(n-octylsulfonamido) phenyl)benzoxazolate (Compound 6a)

The reaction of 13.71 g (0.10 mole) of anthranilic acid with 10.91 g (0.10 mole) of ortho-aminophenol was carried out in 100 ml of polyphosphoric acid at 200° C. After 10 hours from the start of the reaction. the reaction mixture was poured into ice water and the precipitate was filtered and dried. The solid thus obtained was purified by column chromatography and concentrated to give 10.28 g (0.048 mole, 49%) of ortho-aminophenylbenzoxazole (Compound K).

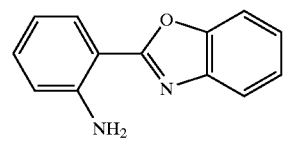

(Compound K)

Next, 10.28 g (0.048 mole) of the ortho-aminophenylbenzoxazole was suspended in 40 ml of pyridine and the suspension was cooled to 0° C. The suspension was treated with 10.21 g (0.048 mole) of n-octanesulfonyl chloride and the temperature was allowed to rise to room temperature. After 5 hours, 100 ml of water was added to the reaction mixture and the separated brown powder was filtered. The solid thus obtained was purified by silica gel chromatography to give 15.67 g (0.043 mole, 90.0%) of 2-(2-(n-octanesulfonylamino)phenyl)benzoxazolate (Compound L) as brown powder.

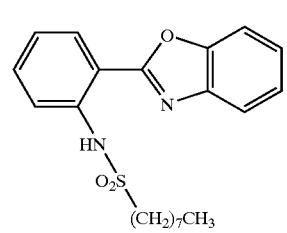

(Compound L)

Thereafter, 5.0 g (0.014 mole) of Compound L, 1.91 g (0.014 mole) of zinc chloride and 4.25 g (0.042 mole) of triethylamine were suspense in 100 ml of ethanol and allowed to react at room temperature. After 3 hours, the separated white powder was filtered, washed with ethanol and purified by sublimation to give 5.0 g (90.0%) of a compound (Compound 6a) as white crystals.

$^1$H-NMR. δ (DMSO-d6): 0.70 (t, 6H), 1.00–1.05 (br m, 28H), 7.44 (m, 2H), 7.50 (m, 6H), 7.74 (d, J=8.0 Hz, 4H), 7.94 (d, J=8.4 Hz, 2H), 8.34 (d, J=8.4 Hz, 2H) MS: m/z 836 (M$^+$).

EXAMPLE 3

Table 1 shows solubility (wt %) of some of the compounds in chloroform and toluene. The symbols in the table stand for the following: ○, completely soluble; Δ, a slight amount remaining insoluble; X, a considerable amount remaining insoluble.

TABLE 1

|  | Chloroform | | | | Toluene | | | |
| --- | --- | --- | --- | --- | --- | --- | --- | --- |
|  | 0.1% soln. | 1% soln. | 5% soln. | 10% soln. | 0.1% soln. | 1% soln. | 5% soln. | 10% soln. |
| Alq3 | Δ | X | X | X | X | X | X | X |
| Compound M | Δ | X | X | X | X | X | X | X |
| Compound N | ○ | Δ | X | X | X | X | X | X |

TABLE 1-continued

|  | Chloroform | | | | Toluene | | | |
| --- | --- | --- | --- | --- | --- | --- | --- | --- |
|  | 0.1% soln. | 1% soln. | 5% soln. | 10% soln. | 0.1% soln. | 1% soln. | 5% soln. | 10% soln. |
| Compound A | ○ | ○ | ○ | ○ | ○ | ○ | Δ | X |
| Compound 6a | ○ | ○ | ○ | ○ | ○ | ○ | Δ | X |

Notes)
Compound M: Zinc bis-8-(methylsulfonamido)quinolinate
Compound N: Zinc bis-8-(n-butylsulfonamido)quinolinate

EXAMPLE 4

Synthesis of zinc bis-8-(methylsulfonamido) quinolinate (Compound M)

The reaction of 5.0 g (0.0347 mole) of 8-aminoquinoline with 3.97 g (0.0347 mole) of methylsulfonyl chloride was carried out in 10 ml of pyridine at room temperature. After 2 hours from the start of the reaction, the reaction mixture was washed with water, extracted with diethyl ether, purified by column chromatography and concentrated to give 10.32 g (0.032 mole, 92%) of 8-(methylsulfonamido)quinoline. Then, 5.0 g (0.016 mole) of the 8-(methylsulfonamido) quinoline, 3.07 g (0.023 mole) of zinc chloride and 6.98 g (0.069 mole) of triethylamine were suspended in 30 ml of ethanol and allowed to react at room temperature. After 3 hours, the separated yellow powder was filtered, washed with ethanol and purified by column chromatography to give 10.48 g (90.0%) of Compound M as yellow crystals. The maximum PL wavelength of this compound in chloroform was 505 nm.

$^1$H-NMR. δ (DMSO-d6): 1.04 (m, 6H), 7.59 (t, J=8.0 Hz, 2H), 7.66 (m, 2H), 7.80 (m, 4H), 8.20 (d, J=7.2 Hz, 2H), 8.75 (m, 2H).

EXAMPLE 5

Synthesis of zinc bis-8-(n-butylsulfonamido) quinolinate (Compound N)

The reaction of 5.0 g (0.0347 mole) of 8-aminoquinoline with 5.43 g (0.0347 mole) of n-butanesulfonyl chloride was carried out in 10 ml of pyridine at room temperature. After 2 hours from the start of the reaction, the reaction mixture was washed with water, extracted with diethyl ether, purified by column chromatography and concentrated to give 10.32 g (0.032 mole, 92%) of 8-(n-butylsulfonamido)quinoline. Then, 5.0 g (0.019 mole) of the 8-(n-butylsulfonamido) quinoline, 2.12 g (0.019 mole ) of zinc chloride and 4.76 g (0.047 mole) of triethylamine were suspended in 30 ml of ethanol and allowed to react at room temperature. After 3 hours, the separated yellow powder was filtered, washed with ethanol and purified by column chromatography to give 8.62 g (91.0%) of Compound N as yellow crystals. The maximum PL wavelength of this compound in chloroform was 510 nm.

$^1$H-NMR. δ (DSMO-d6) 0.81 (t, J=7.2 Hz, 6H), 1.31 (m, 4H), 1.68 (m, 2H), 1.67 (m, 4H), 3.20 (t, J=7.2 Hz, 4H), 7.56 (dd, J=1.6 Hz, 7.6 Hz, 2H), 7.65 (d, J=7.6 Hz, 2H), 7.69 (m, 2H), 7.77 (dd, J=4.4 Hz, 8.0 Hz, 2H), 8.70 (dd, J=1.6 Hz, 8.4 Hz, 2H), 8.81 (dd, J=1.6 Hz, 4.8 Hz, 2H).

EXAMPLE 6

Synthesis of Compound 3

Compound 3 which is a metal complex containing an ortho-(2-pyridyl)aniline derivative as a ligand was synthesized according to the aforementioned reaction scheme.

The reaction of 8.0 g (0.022 mole) of 2-tributylstannylpyridine with 4.92 g (0.020 mole) of ortho-nitroiodobenzene was carried out in the presence of 0.70 g (0.001 mole) of dichlorobis(triphenlylphosphine)palladium in 100 ml of tetrahydrofuran at 110° C. After 24 hours from the start of the reaction, a saturated aqueous sodium chloride solution was added to the reaction mixture and the reaction product was extracted with ether. The ether layer was then washed with a saturated aqueous sodium chloride solution, dried over magnesium sulfate and concentrated. The resulting liquid was purified by column chromatography and concentrated to give 0.96 g (0.0048 mole, 24.9%) of ortho-(2-pyridyl)nitrobenzene as brown liquid.

Next, 0.96 g (4.8 mmols) of the ortho-(2-pyridyl) nitrobenzene, 0.072 g (0.48 mmol) of copper sulfate and 0.91 g (24.0 mmols) of sodium borohydride were suspended in 30 ml of ethyl alcohol and allowed to react at room temperature. After 5 hours from the start of the reaction, the reaction mixture was filtered through celite, 50 ml of ether was added to the filtrate, the organic layer was washed with a saturated aqueous sodium chloride solution, dried over magnesium sulfate and concentrated. The liquid thus obtained was purified by column chromatography and concentrated to give 0.38 g (2.26 mmoles, 47%) of ortho-(2-pyridyl)aniline as a brown liquid.

Then, 0.38 g of the ortho-(2-pyridyl)aniline was suspended in 20 ml of pyridine and cooled to 0° C. The suspension was treated with 0.47 g (2.49 mmols) of para-toluenesulfonyl chloride and the temperature of the reaction mixture was allowed to rise to room temperature. After 5 hours, 100 ml of water was added to the reaction mixture and the separated white powder was filtered. The resulting mass was purified by silica gel chromatography to give 0.67 g (2.08 mmols, 91.7%) of Compound 22 as brown liquid.

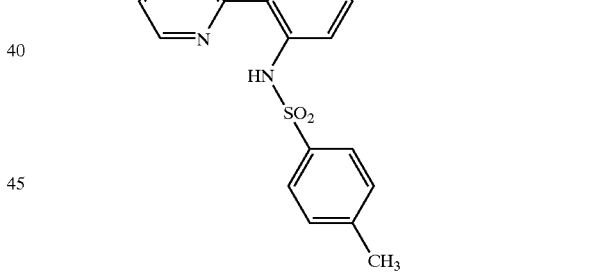

(Compound 22)

Next, 0.67 g (2.08 mmols) of Compound 22, 0.28 g (2.08 mmols) of zinc chloride and 0.63 g (6.24 mmols) of triethylamine were suspended in 30 ml of ethanol and allowed to react at room temperature. After 3 hours, the separated white powder was filtered, washed with ethanol and purified by sublimation to give 0.74 g (90.0%) of Compound 3 as white crystals.

$^1$H-NMR. δ (DSMO-6d): 2.19 (s, 6H), 6.78 (d, J=7.6 Hz, 4H), 7.11 (d, J=7.2 Hz, 6H), 7.28 (d, J=8.0 Hz, 2H), 7.32 (J=8.0 Hz, 2H), 7.39 (J=7.6 Hz., 2H), 7.45 (d, J=8.4 Hz, 2H), 7.51 (m, 2H), 7.93 (t, J=7.2 Hz, 2H), 8.88 (m, 2H)MS: m/z 711 (M$^+$).

EXAMPLE 7

Synthesis of Compound 2a

The reaction of 13.71 g (0.10 mole) of anthranilic acid with 10.91 g (0.10 mole) of ortho-aminophenol was carried out in 100 ml of polyphosphoric acid at 200° C. After 10 hours from the start of the reaction, the reaction mixture was poured into ice water and the precipitate was filtered and dried. The solid thus obtained was purified by column chromatography and concentrated to give 10.28 g (0.048 mole, 49%) of ortho-aminophenylbenzoxazole.

Next, 10.28 g (0.048 mole) of the ortho-aminophenylbenzoxazole was suspended in 10 ml of pyridine and cooled to 0° C. The suspension was treated with 9.15 g (0.048 mole) of p-toluenesulfonyl chloride and the temperature was allowed to rise to room temperature. After 5 hours, 100 ml of water was added and the separated brown powder was filtered. The solid thus obtained was purified by silica gel chromatography to give 15.67 g (0.043 mole, 90.0%) of 2-(2-(p-toluenesulfonylamino)phenyl) benzoxazole (Compound 23) as brown solid.

(Compound 23)

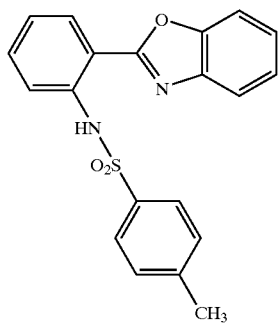

Thereafter, 5.0 g (0.014 mole) of 2-(2-(p-toluenesulfonylamino)phenyl)benzoxazole, 1.91 g (0.014 mole) of zinc chloride and 4.25 g (0.042 mole) of triethylamine were suspended in 100 ml of ethanol and allowed to react at room temperature. After 3 hours, the separated white powder was filtered, washed with ethanol and purified by sublimation to give 5.0 g (90.0%) of Compound 2a as white crystals.

$^1$H-NMR. δ (DMSO-d6): 2.27 (s, 6H), 7.08 (t, J=7.6 Hz, 2H), 7.14 (d, J=8.0 Hz, 4H), 7.30 (t, J 7.6 Hz, 2H), 7.44 (m, 2H), 7.50 (m, 6H), 7.74 (d, J=8.0 Hz, 4H), 7.94 (d, J=8.4 Hz, 2H), 8.34 (d, J=8.4 Hz, 2H) MS: m/z 791 (M$^+$).

EXAMPLE 8

The organic EL element shown in FIG. 1 was made by the use of Compound 2a. FIG. 1 is a cross-sectional view of an example of the organic El elements of this invention and, in the FIGURE, a glass substrate 1, an anode (ITO) 2, a hole transporting material 3, a luminescent and electron transporting material 4, an electron injecting layer (LiF) 5 and a cathode 6 are arranged in this order to form a layered structure.

By the use of a vacuum deposition apparatus of resistance heating type, TPD was deposited to a film thickness of 50 nm on a precleaned glass substrate provided with an ITO electrode (a product of Sanyo Vacuum Industries Co., Ltd.), 15 Ω·m in specific resistance and 2×2 mm$^2$ in electrode area, to form a hole transporting layer while maintaining the degree of vacuum at 5–7 Pa and controlling the rate of deposition by a quartz oscillator controller (a product of ULVAC, Inc.). A luminescent layer was formed on the hole transporting layer by depositing Compound 2a as a luminescent material to a film thickness of 50 nm in the same vacuum deposition apparatus without breaking vacuum. While maintaining the existing vacuum condition, lithium fluoride (LiF) was deposited on the luminescent layer to a film thickness of 0.6 nm to form an electron injecting layer and aluminum (Al) was deposited on the electron injecting layer to a film thickness of 20 nm to form a cathode. When voltage was applied to pass a current through the organic EL element thus prepared, the element emitted blue light of a luminance of 6,500 cd/m$^2$ at a turn-on voltage of 5.5 V. The drive current density at a luminance of 1,000 cd/m$^2$ was 60 A/cm$^2$.

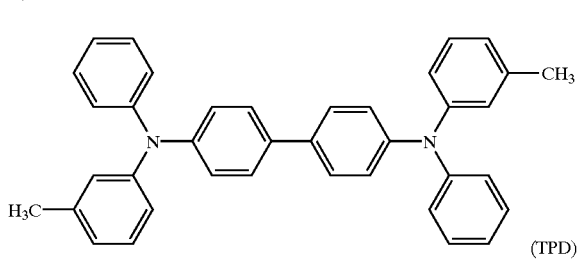

(TPD)

EXAMPLE 9

An organic EL element was prepared as in Example 8 except using Compound 3a as a luminescent material. When voltage was applied to pass a current through the organic EL element thus prepared, the element emitted blue light of a luminance of 6,800 cd/m$^2$ at a turn-on voltage of 5.5 V. The drive current density at a luminance of 1,000 cd/m$^2$ was 65 A/cm$^2$.

COMPARATIVE EXAMPLE 1

An organic EL element was prepared as in Example 8 except using aluminum-8-hydroxyquinoline complex (Alq3) as a luminescent material. When voltage was applied to pass a current through the organic EL element thus prepared, the element emitted green light of a luminance of 18,000 cd/m$^2$ at a turn-on voltage of 3.5 V. The drive current density at a luminance of 1,000 cd/m$^2$ was 50 A/cm$^2$.

EXAMPLE 10

An organic EL element was prepared as in Example 8 except using Compound O as a luminescent material. When voltage was applied to pass a current through the organic EL element thus prepared, the element emitted green light of a luminance of 15,000 cd/m$^2$ at a turn-on voltage of 3.5 V. The drive current density at a luminance of 1,000 cd/m$^2$ was 55 A/cm$^2$.

(Compound 0)

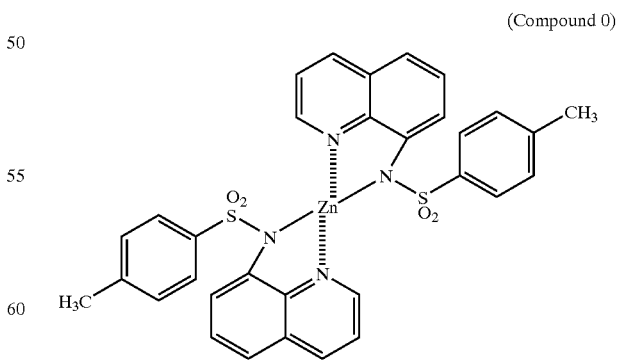

EXAMPLE 11

An organic EL element was prepared as in Example 8 except using Compound 3 as a luminescent material. When voltage was applied to pass a current through the organic EL element thus prepared, the element emitted blue light of a luminance of 6,800 cd/m² at a turn-on voltage of 5.5 V. The drive current density at a luminance of 1,000 cd/m² was 65 A/cm².

EXAMPLES 12–22

EL elements were prepared as in Example 8 except using respectively the compound shown in Table 2 in place of Compound 2a. The luminance at the turn-on voltage is shown for each of the EL elements.

TABLE 2

| Example | Compound | Turn-on voltage for electroluminescence (V) | Luminance (cd/m²) |
| --- | --- | --- | --- |
| 12 | 2 | 5.3 | 6,000 |
| 13 | 4 | 5.1 | 6,200 |
| 14 | 5 | 5.7 | 4,900 |
| 15 | 4a | 4.9 | 3,200 |
| 16 | 5a | 4.8 | 3,800 |
| 17 | 6a | 5.8 | 4,900 |
| 18 | 7a | 5.0 | 4,800 |
| 19 | 11a | 4.8 | 6,400 |
| 20 | 12a | 4.7 | 4,900 |
| 21 | 21a | 5.8 | 3,000 |
| 22 | 22a | 5.2 | 4,800 |

EXAMPLE 23

Poly(tetrahydrothiophenylphenylene), a precursor of poly (phenylvinylene), was applied to a precleaned glass substrate provided with an ITO electrode (a product of Sanyo Vacuum Industries Co., Ltd.), 15 Ω·m in specific resistance and 2×2 mm² in electrode area, and heated to form a hole transporting layer. Compound A as a luminescent material was applied by spin coating to the hole transporting layer, lithium fluoride (LiF) was deposited on the luminescent layer to form an electron injecting layer and aluminum (Al) was deposited on the electron injecting layer to form a cathode. The organic EL element thus prepared emitted light of a luminance of approximately 200 cd/m² at a direct current voltage of 5.0 V.

EXAMPLES 24–30

EL elements were respectively prepared as in Example 23 while replacing Compound A with each of the compounds shown in Table 3. The luminance at a direct current voltage of 5 V is shown for each element in Table 3.

TABLE 3

| Example | Compound | Luminance (cd/m²) |
| --- | --- | --- |
| 24 | 5 | 80 |
| 25 | 6a | 120 |
| 26 | 7a | 80 |
| 27 | 21a | 90 |
| 28 | 22a | 150 |
| 29 | B | 210 |
| 30 | C | 190 |

Industrial Applicability

Fabrication of EL elements from low-molecular-weight EL materials by spin coating or ink jet printing has been considered difficult, but introduction of specific alkyl chains and the like to the molecules has made the resulting compounds soluble in solvents and helped to achieve fabrication of EL elements by a coating process. The use of these compounds produces a striking effect in making fabrication of large-sized EL displays feasible at low cost.

Moreover, the organic EL materials of this invention are useful in fabrication of highly reliable organic El elements which emit blue light at low drive voltage with high luminous efficiency and they can be used in combination with a variety of organic EL materials.

What is claimed is:

1. An organic electroluminescent element which comprises an organic electroluminescent element material between two electrodes at least one of which is transparent, said organic electroluminescent element material being represented by general formula (1)

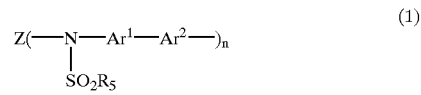

wherein $Ar^1$ is a group represented by the following formula (2), $Ar^2$ is a group represented by the following formula (3) or (4);

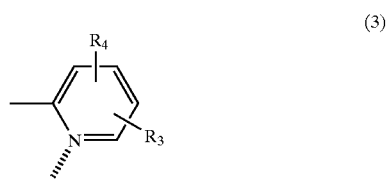

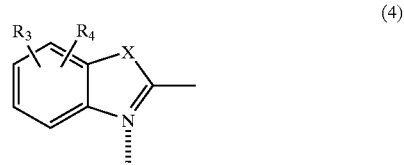

in formulas (2), (3) and (4), $R_1$–$R_4$ are independently hydrogen, alkyl with 1–6 carbon atoms, alkoxy with 1–6 carbon atoms, aryloxy with 6–18 carbon atoms, phenyl, substituted phenyl with up to 18 carbon atoms, amino, substituted amino or hydroxyl; $R_1$ and $R_2$ or $R_3$ and $R_4$ in adjacent position may join together to form a saturated or unsaturated 5- or 6-membered ring;

$R_5$ is hydrogen, alkyl with 6–20 carbon atoms, alkoxy with 1–6 carbon atoms, aryloxy with 6–18 carbon atoms, alkyl with 1–16 carbon atoms optionally containing one or two or more substituents selected from phenyl, amino, cyano, nitro, hydroxyl and halogen, an aryl with 6–20 carbon atoms or an aralkyl with 7–20 carbon atoms;

X is O or S;

Z is a metal linked to N in formula (1) and N constituting the hetero ring of $Ar^2$ and is a divalent or trivalent metal selected from zinc, aluminum, copper, beryllium, ruthenium, cobalt, rhodium, iridium and platinum; and n is 2 or 3.

2. An organic electroluminescent element as described in claim 1, wherein a luminescent layer or an electron transporting layer comprises at least one kind of said organic electroluminescent element material.

3. An organic electroluminescent element as described in claim 1 wherein said organic electroluminescent element material is a compound selected from the group consisting of zinc bis-2-(2-(p-toluenesulfonamido)phenyl)pyridinate, zinc bis-2-(2-(n-octylsulfonamido)phenyl)pyridinate, zinc bis-2-(2-(p-toluenesulfonamido)phenyl) benzoxazolate, zinc bis-2-(2-(p-toluenesulfonamido)phenyl) benzothiazolate, zinc bis-2-(2-(n-octylsulfonamido)phenyl)benzoxazolate, and zinc bis-2-(2-(n-octylsulfonamido)phenyl) benzothiazolate.

4. An organic electroluminescent element as described in claim 1, wherein said organic electroluminescent element material is represented by the following general formula (5)

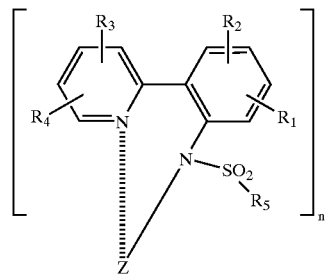

(5)

wherein $R_1$–$R_4$, $R_5$, Z and n are as defined in formulas (1)–(4).

5. An organic electroluminescent element as described in claim 1, wherein said organic electroluminescent element material is represented by the following general formula (6)

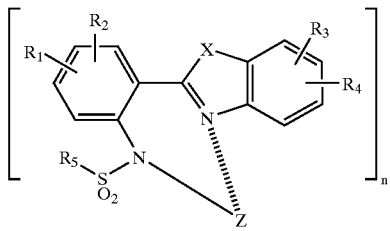

(6)

wherein $R_1$–$R_4$, $R_5$, X, Z and n are as defined in formulas (1)–(4).

* * * * *